(12) United States Patent
Micic (10) Patent No.: US 9,705,423 B1
(45) Date of Patent: Jul. 11, 2017

(54) CONTROLLED BOOTSTRAP DRIVER FOR HIGH SIDE ELECTRONIC SWITCHING DEVICE

(71) Applicant: Woodward, Inc., Fort Collins, CO (US)

(72) Inventor: Dragan Micic, Mount Prospect, IL (US)

(73) Assignee: Woodward, Inc., Fort Collins, CO (US)

( * ) Notice: Subject to any disclaimer, the term of this patent is extended or adjusted under 35 U.S.C. 154(b) by 0 days.

(21) Appl. No.: 15/052,238

(22) Filed: Feb. 24, 2016

(51) Int. Cl.
*H02M 7/539* (2006.01)

(52) U.S. Cl.
CPC .................................. *H02M 7/539* (2013.01)

(58) Field of Classification Search
CPC ..................................................... H02M 7/539
See application file for complete search history.

(56) References Cited

U.S. PATENT DOCUMENTS

| | | | |
|---|---|---|---|
| 5,659,452 | A | 8/1997 | Blackburn |
| 6,714,067 | B1 | 3/2004 | Farrenkopf |
| 6,844,779 | B2 | 1/2005 | McEwen |
| 6,917,240 | B2 | 7/2005 | Trafton et al. |
| 7,026,801 | B2 | 4/2006 | Fowler et al. |
| 7,432,756 | B2 | 10/2008 | Boe |
| 7,589,571 | B1 | 9/2009 | Wittenbreder, Jr. |
| 7,592,831 | B2 | 9/2009 | Locatelli et al. |
| 7,609,036 | B2 | 10/2009 | Bartolo et al. |
| 7,710,167 | B2 | 5/2010 | Bernacchia |
| 7,733,135 | B2 | 6/2010 | Dagli et al. |
| 7,986,172 | B2 | 7/2011 | Sicard |
| 8,154,334 | B2 | 4/2012 | Wang |
| 8,581,638 | B2 | 11/2013 | Chen et al. |
| 8,610,413 | B2 | 12/2013 | Bahramian et al. |
| 8,749,277 | B2 | 6/2014 | Kenney |
| 8,779,733 | B2 | 7/2014 | Chen |
| 8,779,809 | B2 | 7/2014 | Murakami et al. |

(Continued)

FOREIGN PATENT DOCUMENTS

WO    WO 95/34946    12/1995

OTHER PUBLICATIONS

"HV Floating MOS-Gate Driver ICs," Application Note AN-978, International Rectifier, Mar. 2007, 30 pages.

(Continued)

*Primary Examiner* — Emily P Pham
(74) *Attorney, Agent, or Firm* — Fish & Richardson P.C.

(57) ABSTRACT

The subject matter of this specification can be embodied in, among other things, a phase circuit having an output port, and a high side circuit having a first input port, a high side switching device configured to receive power from a high side power bus and switch power to the output port based on a first input signal received at the first input port, a voltage regulating device having a regulator input port, and a bootstrap capacitor coupled between the voltage regulating device and the output port, wherein the regulating device is configured to receive power from the high side power bus and controllably supply power to the bootstrap capacitor based on a regulator input voltage received at the regulator input port, the regulator input voltage based on a voltage difference between a voltage present on the output port and a voltage present on the high side power bus.

21 Claims, 6 Drawing Sheets

(56) References Cited

U.S. PATENT DOCUMENTS

| | | |
|---|---|---|
| 8,860,344 B2 | 10/2014 | Andersen |
| 8,994,411 B2 | 3/2015 | Draxelmayr et al. |
| 9,024,681 B2 | 5/2015 | Murakami et al. |
| 2013/0293214 A1 | 11/2013 | Chang et al. |
| 2014/0062449 A1 | 3/2014 | Qu et al. |
| 2015/0061611 A1* | 3/2015 | Li .................. H02M 3/1588 323/235 |
| 2015/0077081 A1 | 3/2015 | Ejury et al. |
| 2015/0188425 A1 | 7/2015 | Chang et al. |
| 2015/0263629 A1 | 9/2015 | Stuler et al. |
| 2015/0311797 A1 | 10/2015 | Okamatsu et al. |

OTHER PUBLICATIONS

"Brushless DC Motor Controller," Texas Instruments, UC2625-EP, Mar. 2008, 26 pages.
Farchild, "Design and Application Guide of Bootstrap Circuit for High-Voltage Gate-Drive IC," App Note AN-6076, Copyright 2008, 15 pages.
Intersil, "80V, 500mA, 3-Phase MOSFET Driver", Datasheet, p/n HIP4086A, Feb. 1, 2013, 16 pages.
Merello et al. "Using Monolithic High Voltage Gate Drives," International Rectifier, published on or before 2012, 11 pages.
International Rectifier, "IRS 2110 (−1, −2, S) PbF, IRS2113 (−1, −2, S) PbF, High and Low Side Driver", Datasheet, PD60249, Jan. 22, 2007, 19 pages.

* cited by examiner

CONTROLLED BOOTSTRAP DRIVER FOR HIGH SIDE ELECTRONIC SWITCHING DEVICE

TECHNICAL FIELD

This instant specification relates to inverter circuits having bootstrap capacitors.

BACKGROUND

In some designs of power inverter circuits, two power MOSFET switches are arranged in a totem pole (half-bridge) topology. The power MOSFET switches are driven to conduct alternately, in which one of the MOSFET switches is designated as a high side switch, and the other MOSFET switch is designated as the low side switch. By selectively switching the power MOSFET switches in an alternating fashion, a load can be driven with an alternating current, forming a DC to AC inverter.

The gate of the high side switch is typically driven by a bootstrapped power supply, and a bootstrap capacitor is used to increase the voltage available to the gate of the high side switch. A MOSFET is a voltage-controlled device which will allow very little gate current to pass, thereby making it possible to utilize the charge inside the capacitor for control purposes. However, due to parasitic gate current and non-ideal (i.e. finite) internal resistance the capacitor will eventually lose its charge. At very low (or steady-state) switching speeds, the bootstrap capacitor may discharge without having an opportunity to recharge. Most control schemes that use a bootstrap capacitor force the high side driver off for a minimum time to allow the capacitor to recharge.

Such bootstrapped architectures are generally operated at less than 100% duty cycle rather than a steady-state basis, sacrificing a margin of performance in order to allow for the capacitor to recharge. However, such circuits may still encounter situations in which external conditions may cause a 100% or near-100% operating condition, such as when a motor being driven by the inverter circuit becomes stalled.

SUMMARY

In general, this document describes inverter circuits having bootstrap capacitors.

In a first aspect, a circuit includes a phase circuit having an output port, and a high side circuit having a first input port, a high side switching device configured to receive power from a high side power bus and switch power to the output port based on a first input signal received at the first input port, a voltage regulating device having a regulator input port, and a bootstrap capacitor coupled between the voltage regulating device and the output port, wherein the voltage regulating device is configured to receive power from the high side power bus and controllably supply power to the bootstrap capacitor based on a regulator input voltage received at the regulator input port, the regulator input voltage based on a voltage difference between a voltage present on the output port and a voltage present on the high side power bus.

Various embodiments can include some, all, or none of the following features. The circuit can include a diode coupled between the output port and the regulator input port, wherein the based on a voltage difference between a voltage on the bootstrap capacitor and a reverse breakdown voltage of the diode. The diode can be a Zener diode. The high side circuit can include a resistor coupled between the high side power bus and the regulator input port. The phase circuit can include a low side circuit having a second input port, and a low side switching device configured to receive power from the output port and switch the power to a low side power bus based on a second input signal received at the second input port. The low side power bus can be at ground. The first input signal may not be active when the second input signal is active, and the second input signal may not be active when the input signal is active. The voltage regulating device can be configured to receive power from the high side power bus and controllably supply power to the bootstrap capacitor when both of the first input signal and the second input signal are not active. The circuit can be an inverter power supply having the phase circuit, and at least another phase circuit configured to switch power to another output port based on another input signal received at another input port, and receive power from the high side power bus and controllably supply power to another bootstrap capacitor.

In a second aspect, a method of operating an inverter power supply includes providing power received from a high side power bus to a first switching device configured to switch power to an output port based on a first input signal received at a first input port, providing power received from the high side power bus to a voltage regulating device configured to controllably supply power to a bootstrap capacitor coupled between the voltage regulating device and the output port based on a regulator input voltage received at a regulator input port, providing, by the first switching device and in response to the first signal, power to the output port, blocking by the first switching device and in absence of the first input signal power from the output port, receiving at the regulator input port the regulator input voltage as a voltage difference between an output voltage on the output port and a voltage present on the high side power bus, operating the voltage regulating device based on the regulator input voltage, and charging the bootstrap capacitor with power received from the high side power bus.

Various implementations can include some, all, or none of the following features. Receiving, at the regulator input port, the regulator input voltage as a voltage difference between an output voltage on the output port and a voltage present on the high side power bus can include providing the output voltage to the regulator input port through a diode coupled between the output port and the regulator input port, wherein the regulator input voltage is further based on a voltage difference between a voltage on the bootstrap capacitor and a reverse breakdown voltage of the diode. The diode can be a Zener diode. Charging the bootstrap capacitor with power from the high side power bus can include providing power to the bootstrap capacitor through a resistor coupled between the power supply and the regulator input port. The method can include providing the output voltage to ground through a second switching device configured to switch the output voltage to a low side power bus based on a second input signal received at a second input port. The first input signal may not be active when the second input signal is active, and the second input signal may not be active when the first input signal is active. The method can include charging the bootstrap capacitor with power received from the high side power bus when both the first input signal and the second input signal are not active. The method can include providing power received from the high side power bus to a second switching device configured to switch power to a second output port based on a second input signal received at a second input port, providing power received from the high side power bus to a second voltage regulating device configured to controllably supply power to a second bootstrap capacitor coupled between the second voltage regulating device and the second output port based on a second regulator input voltage received at a second regulator input port, providing, by the second switching device and in response to the second input signal, power to the second output port, blocking, by the second switching device and in absence of the second input signal, power from the output port, receiving, at the second regulator input port, the second regulator input voltage as a second voltage difference between a second output voltage on the second output port and the voltage present on the high side power bus, operating the second voltage regulating device based on the second regulator input voltage, wherein the second regulator input voltage is based on a second voltage difference between the second output voltage and the voltage present on the high side power bus, and charging the second bootstrap capacitor with power received from the high side power bus. The method can include providing the output voltage to an electric actuator, stalling the electric actuator to create a stall condition, and charging the bootstrap capacitor from the high side power bus during the stall condition. The first input signal can be a direct current (DC) signal. The first input signal can be a pulse width modulated (PWM) signal. The first input signal can be a 0% duty cycle PWM signal.

The systems and techniques described here may provide one or more of the following advantages. First, a system can increase current loop bandwidth by enabling the top switch to turn on at a first signal pulse after a stall condition. Second, the system can enable the top switch of an inverter circuit to work in linear mode instead ohmic mode when the gate drive circuit has no under-voltage protection for top switches since, in the linear mode, a MOSFET (IGBT) can dissipate enough power to shorten the switch life-cycle or lead to a catastrophic failure, especially in high voltage applications (e.g., DC_Link voltage>~270V).

The details of one or more implementations are set forth in the accompanying drawings and the description below. Other features and advantages will be apparent from the description and drawings, and from the claims.

DETAILED DESCRIPTION

This document describes systems and techniques for recharging bootstrap capacitors in inverter circuits, such as motor control circuits. In general, the circuits described in this document use controllable switching devices to recharge bootstrap capacitors in an arrangement that extends the operability of the circuit to 100% duty cycle, resists negative effects of steady-state conditions (e.g., motor stall), and powers multiple phases from a shared power supply.

Generally speaking, inverter circuits receive input power and one or more pulsed or pulse width modulated (PWM) phase control inputs, and provide one or more phases of inverted (e.g., AC) output power to an electrical load. At lower switching speeds, the bootstrap capacitor of some prior inverter circuits has a tendency to discharge, which in a stall or at low speed conditions may lead to loss of power (e.g., when a MOSFET motor bridge is unable to provide sufficient current to a load's motor winding). Some prior designs provide a small additional current to the bootstrap capacitor from a charge pump during stall conditions. Such circuits generally do not have a second power source and the charging current can be very small, which may lead to capacitor discharge, and in the case of motor loads, a loss of torque.

Some prior inverter circuits address the recharging problem by utilizing p-channel MOSFETs on the top of the bridge circuit. This method, however, results in higher power losses due to p-channel MOSFETs' slow transition to the "off" state and higher conductive losses due to higher RDS(on) (e.g., "on" resistance). These losses may be higher (e.g., 2×-3× higher) compared with bootstrapped n-channel MOSFET designs. Some prior inverter circuits address the recharging problem by using three independent floating power supplies. This solution, however, generally requires a complex multi-winding isolated power supply, or three independent isolated power supplies, to feed the driver circuitry. As mentioned previously, the circuits described below use controllable switching devices to recharge bootstrap capacitors in an arrangement that extends the operability of the circuit to 100% duty cycle, resists negative effects of steady-state conditions (e.g., motor stall), and powers multiple phases from a shared power supply.

Figure 1:
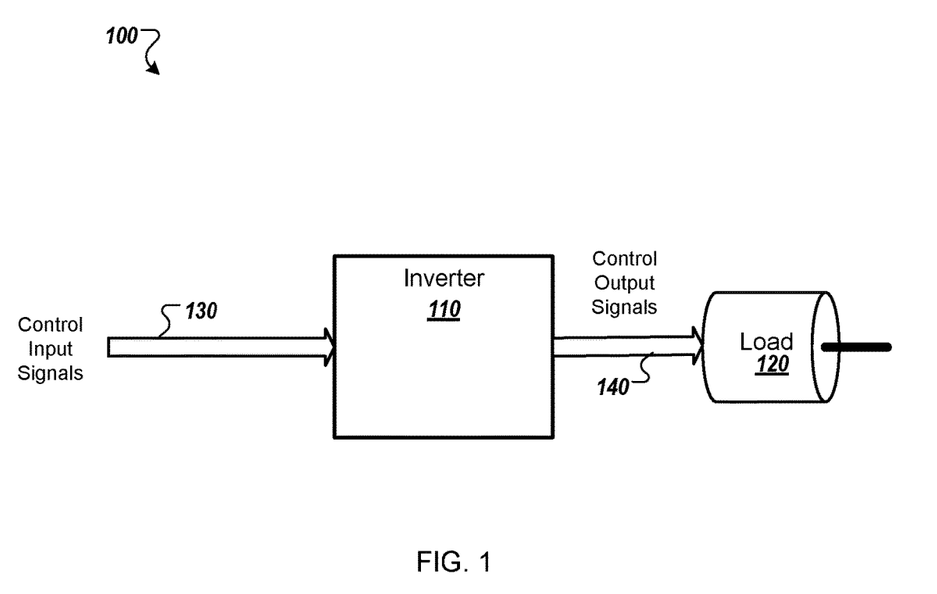
FIG. 1 is a block diagram of an example power delivery system.

FIG. 1 is a block diagram of an example power delivery system 100. The power delivery system 100 includes a power inverter 110 and an electrical load 120 (e.g., a brushless DC motor, a brushed DC motor, a switching power supply, a switching power converter, a stepper motor, an AC induction motor, a solenoid, a relay). The power inverter 110 receives a collection of control input signals 130, such as one or more pulse width modulated (PWM) signals from a control system (not shown). The power inverter 110, in response to the control input signals, provides one or more control output signals 140 to the electrical load 120. For example, the power inverter 110 can receive one or more low power trigger signals as the control input signals 130, and in response provide one or more high power outputs as the control output signals 140. In some implementations, the control output signals 140 can provide controlled high power signals to drive one or more phases of an alternating current (AC) motor or any other appropriate electrical load.

Figure 2:
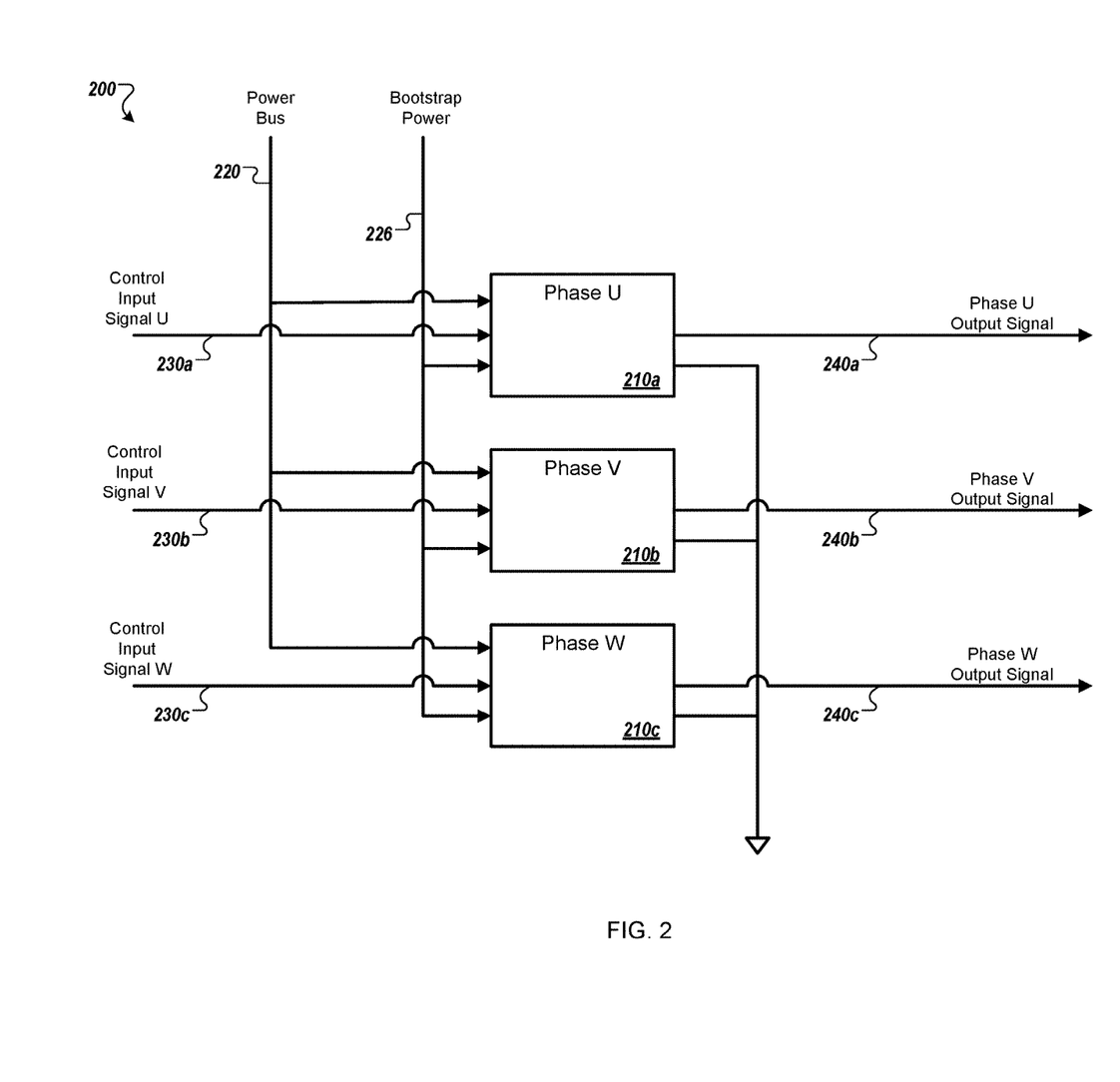
FIG. 2 is a block diagram of an example power inverter.

FIG. 2 is a block diagram of an example power inverter 200. In some embodiments, the power inverter 200 can be the example power inverter 110 of FIG. 1. The power inverter 200 includes a collection of phase power circuits 210a-210c. Each of the phase power circuits 210a-210c receives power (e.g., 12V power) from a power bus 220 that is shared among all of the phase power circuits 210a-210c. Each of the phase power circuits 210a-210c also receives bootstrap power (e.g., 28V power) from a bootstrap power bus 226 that is shared among all of the phase power circuits 210a-210c.

Each of the example phase power circuits 210a-210c receives control input signals from a corresponding collection of control input signal lines 230a-230c. In some embodiments, each of the control input signals can be one or more of the control input signals 130. Each of the example phase power circuits 210a-210c provides, in response to signals received on corresponding ones of the control input signals 230a-230c, a corresponding phase output signal on corresponding ones of a collection of phase output signal lines 240a-240c. In some embodiments, each of the phase output signals can be one or more of the control output signals 140. For example, the phase power circuit 210a can receive one or more low power PWM signals on the control input signal lines 230a, and in response to the phase power circuit 210a provide a high power signal at the phase output signal line 240a (e.g., to drive one corresponding phase of an AC motor).

In the example of power inverter 200, three phase power circuits 210a-210c are shown and described. In some examples, such a configuration can be used to drive a load such as a three-phase AC motor. In other embodiments of the power inverter 200, any appropriate number of the phase power circuits 210a-210c can be used to drive any appropriate embodiment of the electrical load 120 having a corresponding number of electrical phases.

Figure 3:
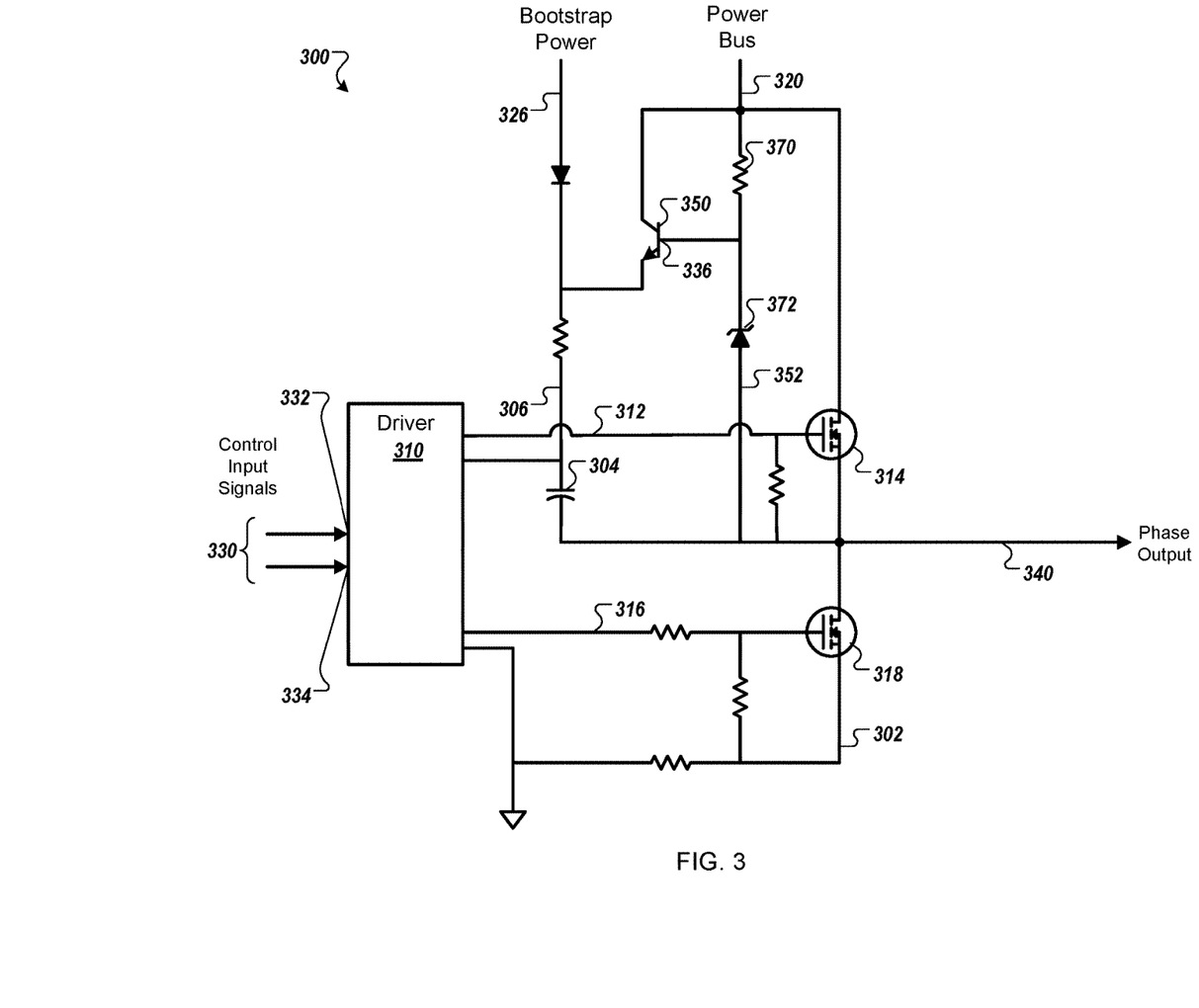
FIG. 3 is a schematic diagram of an example phase circuit of a power inverter.

FIG. 3 is a schematic diagram of an example phase power circuit 300 of a power inverter. In some embodiments, the example phase power circuit 300 can be one of the example phase power circuits 210a-210c of the example power inverter 200 of FIG. 2.

The phase power circuit 300 includes a driver circuit 310. The driver circuit 310 is configured to receive one or more control input signals on a collection of control input signal lines 330 received at an input port 332 and at an input port 334. In some embodiments, the control input signals can be low-power signals provided by a controller (not shown). In some embodiments the control input signals can be some or all of the control input signals 130 of the example power delivery system 100 of FIG. 1. In some embodiments, the control input signal lines 330 can be some or all of the control input signal lines 230a-230c of the example power inverter 200 of FIG. 2.

The driver circuit 310 is configured to provide a high side switching signal on a high side signal line 312. The high side signal line 312 is in electrical communication with a high side switching device 314. The high side switching device 314 is configured to receive power (e.g., 12V) from a high side power bus 320 (e.g., the example power bus 220 of FIG. 2) and controllably provide that power as a high side phase output signal to a phase output signal line 340 based on the state of the high side switching signal on the high side signal line 312. For example, the high side switching device 314 can be a MOSFET with its drain connected to the high side power bus 320, its source connected to the phase output signal line 340, and its gate connected to the high side switching signal line 312. When the high side switching signal is active, the high side switching device 314 passes the power from the high side power bus 320 to the phase output signal line 340 as the high side phase output signal.

The driver circuit 310 is configured to provide a low side switching signal on a low side signal line 316. The low side signal line 316 is in electrical communication with a low side switching device 318. The low side switching device 318 is configured to receive power from the phase output signal line 340 and controllably sink that power to a low side power bus 302 to form a low side phase output signal based on the state of the low side switching signal on the low side signal line 316. For example, the low side switching device 318 can be a MOSFET with its drain connected to the phase output signal line 340, its source connected to the low side power bus 302, and its gate connected to the low side switching signal line 316. When the low side switching signal is active, the low side switching device 318 passes the power from the phase output signal line 340 to the low side power bus 302, which presents the low side phase output signal.

The phase power circuit 300 also includes a bootstrap capacitor 304. The bootstrap capacitor 304 electrically connects the phase output signal line 340 to a bootstrap recharging line 306. The bootstrap recharging line 306 is energized by a combination of bootstrap power provided by a bootstrap power bus 326 (e.g., the example bootstrap power bus 226 of FIG. 2) and high side power provided by the high side power bus 320. In some embodiments, the voltage of the bootstrap recharging line 306 can vary with the voltage of the high side power bus 320, with a boost provided by the bootstrap power bus 326 above and relative to the voltage of the power bus 320.

The bootstrap power is controllably provided to the bootstrap recharging line 306 through a voltage regulating device 350. The voltage regulating device 350 receives the high side power from the high side power bus 320, and controllably provides the high side power to the bootstrap recharging line 306 based on a bootstrap feedback signal provided to an input port 336 by a bootstrap feedback signal line 352. When a potential on the bootstrap feedback signal line 352 is high enough to activate the voltage regulating device 350, high side power is allowed to flow from the high side power bus 320 to the bootstrap recharging line 306 in addition to bootstrap power from the bootstrap power bus 326. The potential on the bootstrap feedback signal line 352 is based on the state of the high side switching device 314 and low side switching device 318. In operation, when the high side switching device 314 is configured to accept a conductive state and the low switching device 318 is configured to accept a high impedance state, the potential on bootstrap feedback signal line 352 rises above the voltage of the low side power bus 302. When switches for high and low side change their state respectively for the high side switching device 312 as a high impedance state and for the low side switching device 318 as a conductive state, the potential on the bootstrap feedback signal line 352 falls to the voltage on the low side power bus 302.

The input port 332, the high side switching device 314, the voltage regulating device 350, and the bootstrap capacitor 304 are part of a high side circuit configured to receive power from the high side power bus 320 based on an input signal (e.g., one of the control input signals 330) received at input port 332. The input port 334 and the low side switching device 318 are part of a low side circuit configured to divert power from the high side power bus 320 based on an input signal (e.g., one of the control input signals 330) received at input port 334. In some embodiments, one or more of the control input signals 330 can be direct current (DC) signals. In some implementations, the control input signal 330 at the input port 332 may not be active when the control input signal 330 at the input port 334 is active, and the control input signal 330 at the input port 334 may not be active when the control input signal 330 at the input port 332 is active. In some embodiments, one or more of the control input signals 330 can be pulse width modulated (PWM) signals. In some embodiments, one or more of the control input signals 330 can be 100% duty cycle PWM signals.

Power flows along the bootstrap recharging line 306 to charge the bootstrap capacitor 304. Charge stored by the bootstrap capacitor 304 can be used later to provide periodic bursts of additional power to maintain the conductive state of the high side switching device 314. In the example of the phase power circuit 300, the power present on the phase output signal line 340 is provided back to the voltage regulating device 350 through the bootstrap feedback line 352. The operation of this configuration is discussed further in connection with the descriptions of FIGS. 4A and 4B.

In this configuration, when the phase power circuit 300 experiences a low speed or stall condition, or when the PWM cycle for the low side switching device 318 is not enough to maintain voltage on bootstrap capacitor 304 on its own, the phase power circuit 300 enables recharging of the bootstrap capacitor 304 to a predetermined level. In some implementations, by recharging the bootstrap capacitor 304 from the high side power bus 320, loss of control of the bridge formed by the high side switching device 314 and the low side switching device 318 may be prevented.

When the example electrical load 120 of FIG. 1, for example an electric motor, is controlled to work in a stall condition (e.g., zero RPM, stall torque) or stall-like condition in servo position mode (e.g., zero RPM, rate torque) in the case of TRAP (trapezoidal) drives, one of three motor phases can have zero current. Consequently, the zero-current inverter leg (e.g., both the top and bottom switch) will not pulse width modulate (PWM).

In order to charge the bootstrap capacitor 304, the low side switching device 318 needs to be ON. Without the additional bootstrap charging circuitry of the example phase power circuit 300, without PWM of the low side switching device 318 the bootstrap capacitor 304 would not be charged and leakage current would eventually discharge the bootstrap capacitor 304 below the voltage needed to drive the high side switching device 314. Under such conditions (e.g., without the additional bootstrap charging circuitry), when the next phase sequence requires turning the high side switching device 314 ON, one of two scenarios may happen: the PWM may become disabled (e.g., if the gate drive IC has an under-voltage monitor for the high side switching device 314), or the high side switching device 314 may work in a linear mode. Such stall condition issues are generally not solvable through the design of resistor-capacitor-diode bootstrap components alone. For example, the amount of time that the electrical load 120 will stay in a stall condition may not be known and/or predictable.

The example phase power circuit 300 is configured to take advantage of the fact that the inverter phase that is at zero current is at a voltage potential that is approximately one-half of the high side voltage on the high side power bus 320 relative to the low side voltage at the low side power bus 302. The high side DC link rail is at substantially the same voltage difference compared to the midpoint of lag with zero phase current. This voltage difference can be used to charge the bootstrap capacitor 304 during a stall condition since the reference voltage minus capacitor electrode is connected to the same leg midpoint.

To avoid an overvoltage condition across the bootstrap capacitor 304, a resistor 370, a diode 372, and the voltage regulating device 350 are configured to limit the voltage (e.g., below 15V). In some implementations, the voltage regulating device 350 can be a bipolar junction transistor, and the diode 372 can be a Zener diode arranged, along with the resistor 370, to form a linear voltage regulator (LVR). The LVR is configured to limit the voltage of the bootstrap capacitor 304 to the voltage across the diode 372 minus the base-emitter voltage of the voltage regulating device 350. In some examples, the diode 372 can be a 12V Zener diode, and with a 12V potential on the bootstrap power bus 326 and 28V on the high side power bus, the voltage across the bootstrap capacitor 304 can be 10.5V at stall condition, which is approximately equal to the voltage across the diode 372 minus the base-emitter voltage of the voltage regulating device 350. In such examples, the first after-stall high side switch gate signal can be about 10V and phase current rises with slope:

$$\frac{V_{DC\_Link}}{2 * L_{load\_phase}}$$

where $V_{DC\_Link}$ is in units of volts and $L_{load\_phase}$ is electrical load (e.g., motor phase) inductance in units of henries, can confirm that the high side switching device 314 is in an ohmic region.

Figure 4A:
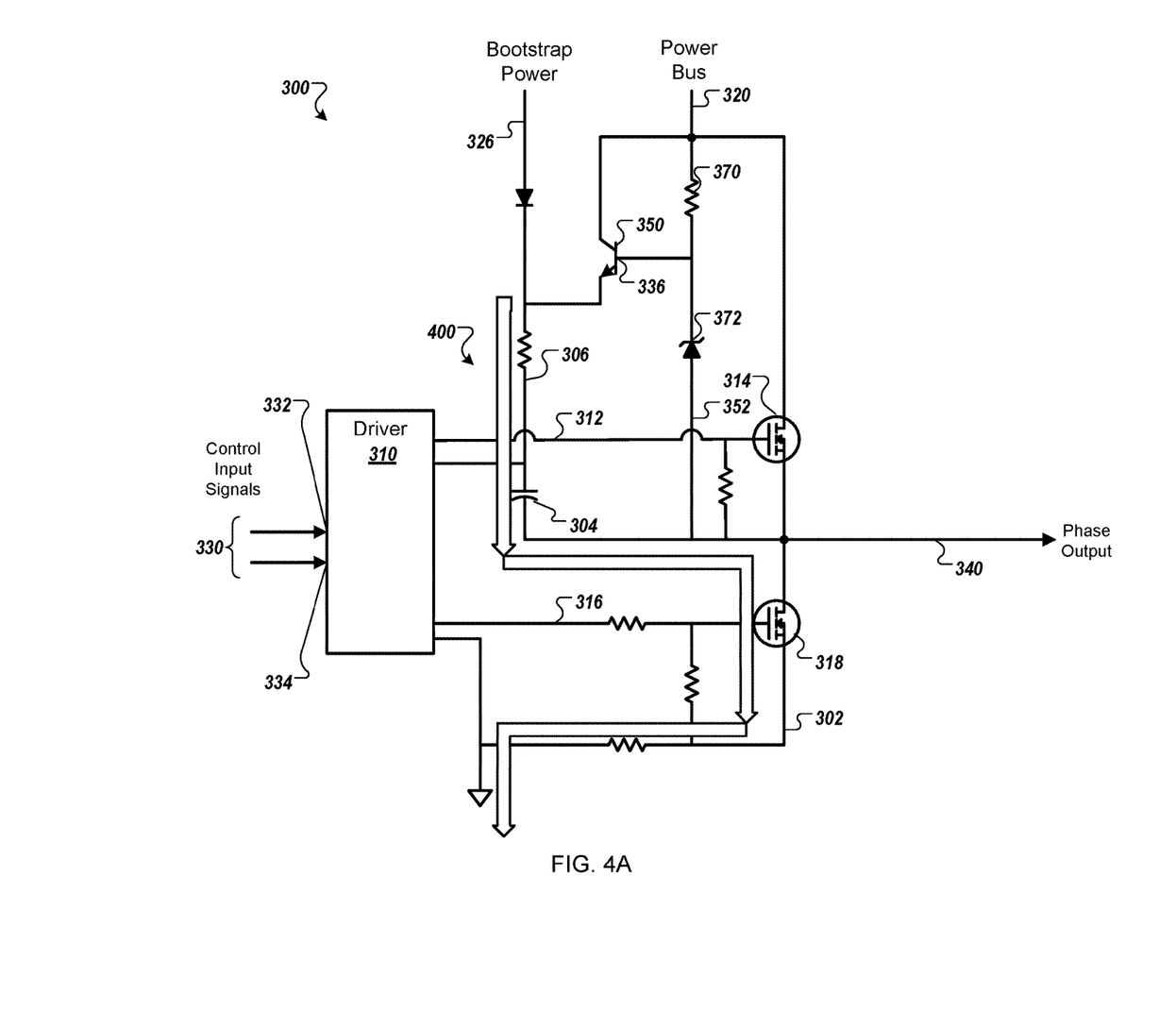
FIGS. 4A and 4B are schematics diagrams of example power flows through an example phase circuit.
Figure 4B:
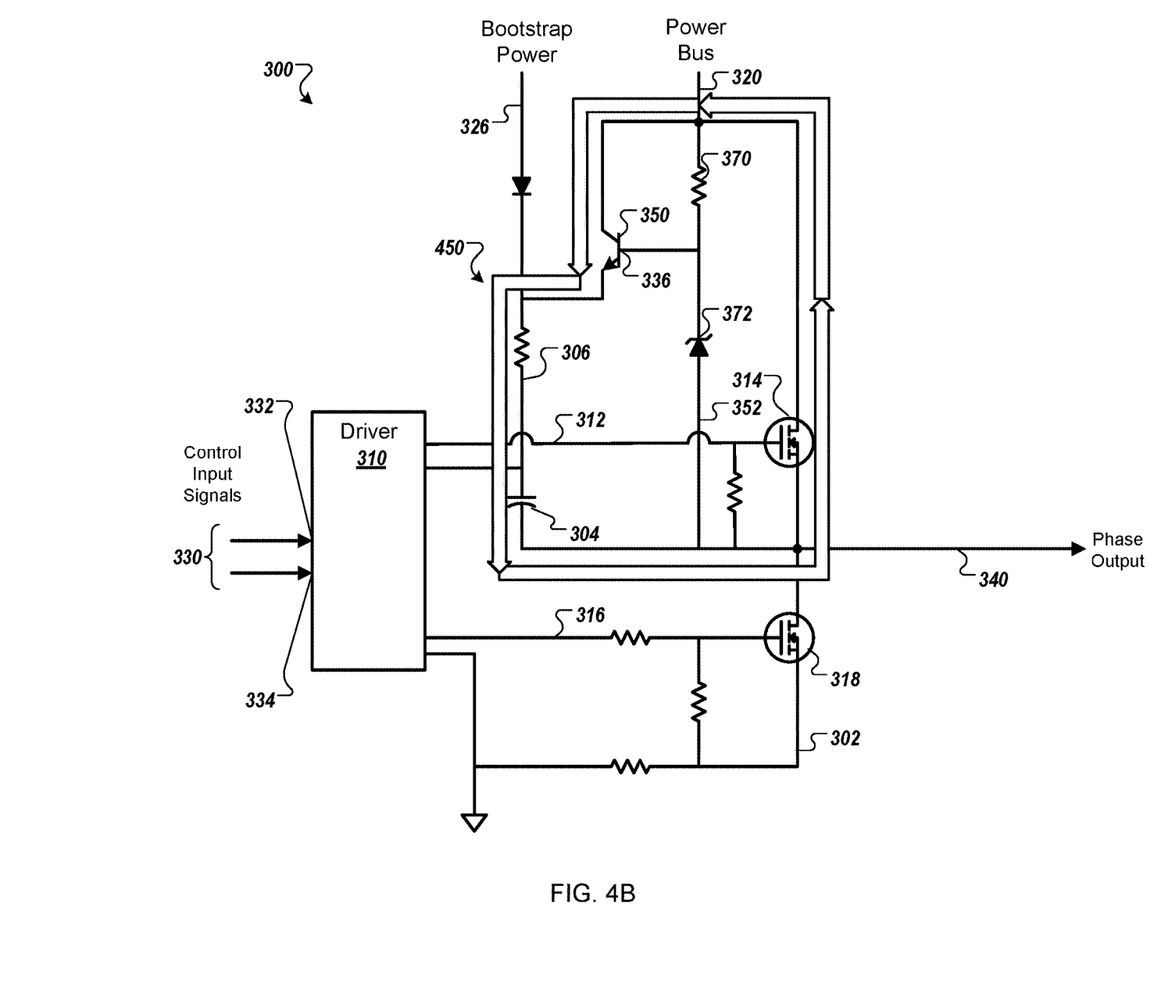

FIGS. 4A and 4B are schematics diagrams of example power flows 400 and 450 through the example phase power circuit 300 of FIG. 3. FIG. 4A illustrates the phase power circuit 300 providing a low side phase signal. In the illustrated example, the driver circuit 310 is providing the low side switching signal on the low side signal line 316. In response to the presence of the low side switching signal on the low side signal line 316, the low side switching device 318 passes the power from the phase output signal line 340 to the low side power bus 302, which presents the low side phase output signal on the phase output signal line 340. Since the bootstrap capacitor 304 is also connected to the phase output signal line 340, the bootstrap capacitor 304 is also at the low side voltage.

In this configuration, the phase output signal on the phase output signal line 340 and the bootstrap feedback signal on the bootstrap feedback signal line 352 are both at low side voltage. As such, the voltage regulating device 350 is inactive, blocking current flow from the high side power bus 324 to the bootstrap capacitor 304. The power flow 400 flows from the bootstrap power bus 326, through the bootstrap capacitor 304, through the low side switching device 318, and out to the low side power bus 302.

FIG. 4B illustrates the phase power circuit 300 providing a high side phase signal. In the illustrated example, the driver circuit 310 is providing the high side switching signal on the high side signal line 312. Potential on the phase output signal line 340 and the bootstrap feedback signal line 352 goes higher than low side power and activates the voltage regulating device 350, allowing high side power to flow as the power flow 450. The power flow 450 flows from the high side power bus 320, through the voltage regulating device 350, to the bootstrap capacitor 304, and through the high side switching device 314 (e.g., through an intrinsic diode of a MOSFET acting as the high side switching device 314) back to the power bus 320. The power flow 450 charges the bootstrap capacitor 304 to the level of the high side power bus 320.

In this example configuration, when the phase power circuit 300 experiences a low speed or stall condition, or when the PWM cycle for the low side switching device 318 is not enough to maintain voltage on bootstrap capacitor 304 on its own, the phase power circuit 300 can recharge the bootstrap capacitor 304 to a predetermined level. In some implementations, by recharging the bootstrap capacitor 304 from the high side power bus 320, loss of control of the bridge formed by the high side switching device 314 and the low side switching device 318 may be prevented.

When the example electrical load 120 of FIG. 1, such as an electric motor, is operated a stall condition (e.g., zero RPM, stall torque) or stall-like condition in a servo position mode (e.g., zero RPM, rate torque) in the case of TRAP (trapezoidal) drives, one of three motor phases can have zero current. Consequently, the zero-current inverter leg (e.g., both the top and bottom switch) will not pulse width modulate (PWM).

In order to charge the bootstrap capacitor 304, the low side switching device 318 needs to be ON. Without the additional bootstrap charging circuitry of the example phase power circuit 300, without PWM of the low side switching device 318 the bootstrap capacitor 304 would not be charged and leakage current would eventually discharge the bootstrap capacitor 304 below the voltage needed to drive the high side switching device 314. Under such conditions (e.g., without the additional bootstrap charging circuitry), when the next phase sequence requires turning the high side switching device 314 ON, one of two scenarios may happen: the PWM may become disabled (e.g., if the gate drive IC has an under-voltage monitor for the high side switching device 314), or the high side switching device 314 may work in a linear mode. Such stall condition issues are generally not solvable through the design of resistor-capacitor-diode bootstrap components alone. For example, the amount of time that the electrical load 120 will stay in a stall condition may not be known and/or predictable.

The example phase power circuit 300 is configured to take advantage of the fact that the inverter phase that is at zero current is at a voltage potential that is approximately one-half of the high side voltage on the high side power bus 320 relative to the low side voltage at the low side power bus 302. The high side DC link rail is at substantially the same voltage difference compared to the midpoint of lag with zero phase current. This voltage difference can be used to charge the bootstrap capacitor 304 during a stall condition since the reference voltage minus the bootstrap capacitor 304 electrode voltage is connected to the same leg midpoint.

The diode 372 will work during a stall condition, but during PWM condition the potential at the midpoint will vary about 0V, from $-V_{DC\_Link}$ and $+V_{DC\_Link}$. Consequently it is possible to charge the bootstrap capacitor 304 to the voltage equal to $V_{DC\_Link}$ voltage. To avoid overvoltage across the bootstrap capacitor 304, additional circuitry is included to limit the voltage (e.g., below 15V). The voltage regulating device 350 and the diode 372 form a linear voltage regulator (LVR). The LVR limits the voltage of the bootstrap capacitor to $V_{diode} - V_{base\_emitter}$.

Figure 5:
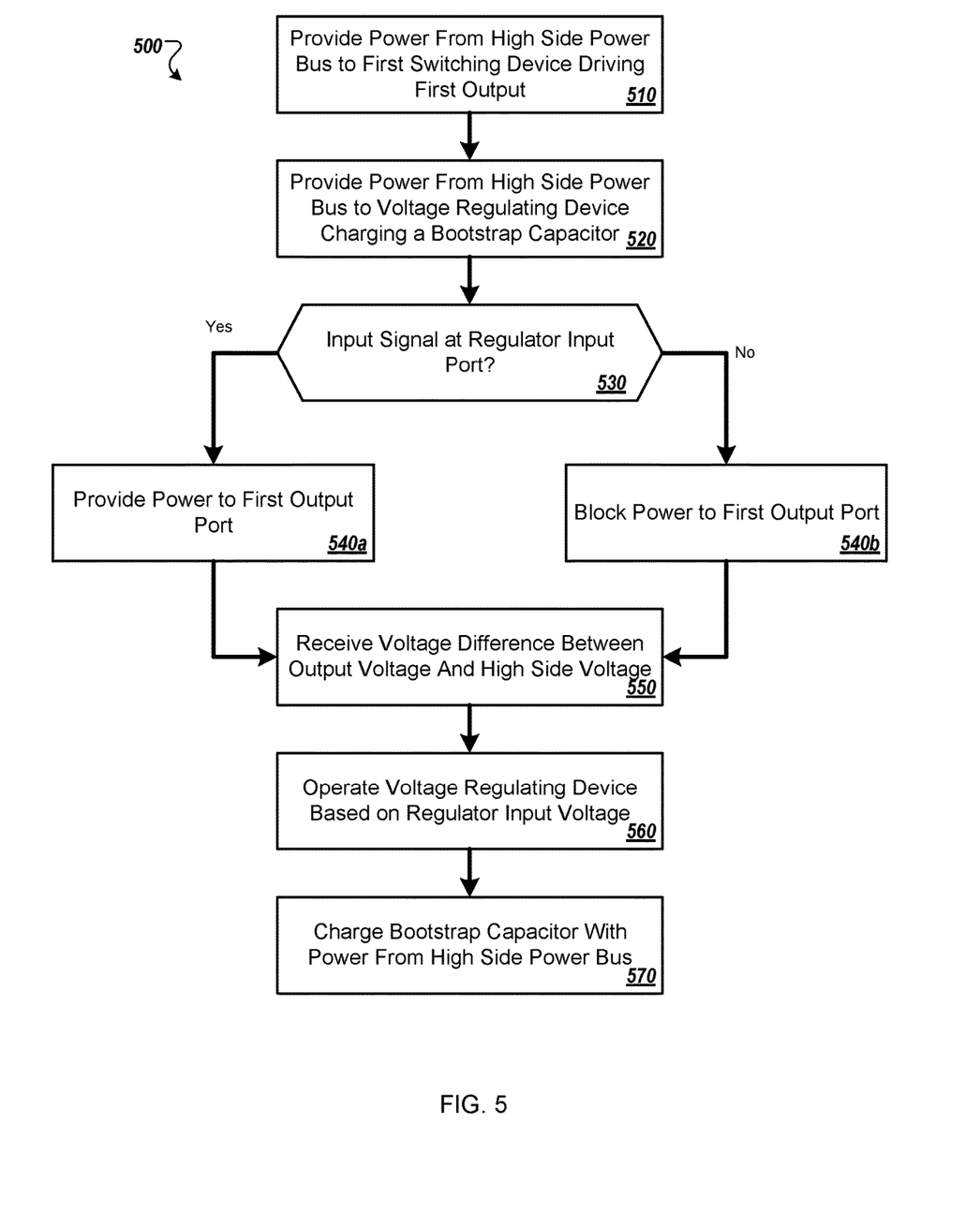
FIG. 5 is a flow diagram of an example process for operating a phase circuit.

FIG. 5 is a flow diagram of an example process 500 for operating a phase circuit. The process 500 may be performed, for example, by a system such as the example power delivery system 100 of FIG. 1, the example power inverter 200 of FIG. 2, and/or the example phase power circuit 300 of FIGS. 3, 4A, and 4B. For clarity of presentation, the description that follows uses the power delivery system 100, the power inverter 200, and the phase power circuit 300 as examples for describing the process 500. However, another system, or combination of systems, may be used to perform the process 500.

At 510, power received from a high side power bus is provided to a first switching device configured to switch power to an output port based on a first input signal received at a first input port. For example, the switching device is arranged to switch power from the high side power bus 320 to the output signal line 340 based on the high side signal line 312.

At 520, power received from the high side power bus is provided to a voltage regulating device configured to controllably supply power to a bootstrap capacitor coupled between the voltage regulating device and the output port based on a regulator input voltage received at a regulator input port. For example, the voltage regulating device 350 is arranged to control the amount of power provided from the high side power bus 320 to the bootstrap capacitor 304.

At 530 a determination is made. If at 530 a high side signal is provided on the high side signal line 312, then at 540a the first switching device provides power to the output port in response to the first signal. For example, the switching device switches power from the high side power bus 320 to the output signal line 340 based on the high side signal line 312. If at 530 no high side signal is present on the high side signal line 312, then at 540b, the first switching device blocks power from the output port in absence of the first input signal. For example, the switching device does not switch power from the high side power bus 320 to the output signal line 340 on the absence of a signal on the high side signal line 312.

At 550, a voltage difference between an output voltage on the output port and a voltage present on the high side power bus is received as the regulator input voltage at the regulator input port. For example, the voltage at the input port 336 is based on the difference between the voltage on the high side power bus 320 and the voltage on the output signal line 340.

At 560, the voltage regulating device is operated based on the regulator input voltage. For example, the voltage regulating device 350 is operated based on the voltage received at the input port 336.

At 570, the bootstrap capacitor is charged with power received from the high side power bus. For example, the voltage regulating device 350 passes power from the high side power bus 320 to the bootstrap capacitor 304 to charge the bootstrap capacitor 304 with high side power.

In some implementations, receiving, at the regulator input port, the regulator input voltage as a voltage difference between an output voltage on the output port and a voltage present on the high side power bus can include providing the output voltage to the regulator input port through a diode coupled between the output port and the regulator input port, wherein the regulator input voltage is further based on a voltage difference between a voltage on the bootstrap capacitor and a reverse breakdown voltage of the diode. In some implementations, the diode can be a Zener diode. For example, the bootstrap feedback line 352 includes the diode 372, which can be a Zener diode, and as such the voltage at the input port 336 is based in part on the breakdown voltage of the diode 372.

In some implementations, charging the bootstrap capacitor with power from the high side power bus can include providing power to the bootstrap capacitor through a resistor coupled between the power supply and the regulator input port. For example, the high side power flows from the high side power bus 320 in part to the input port 336 through the resistor 370.

In some implementations, the output voltage can be provided to ground through a second switching device configured to switch the output voltage to a low side power bus based on a second input signal received at a second input port. For example, the low side power bus 302 can be at ground, and the voltage on the output signal line 340 can be switched to the low side power bus 302 through the low side switching device 318.

In some implementations, the first input signal may not be active when the second input signal is active, and the second input signal may not be active when the first input signal is active. For example, the high side signal line 312 and the low side signal line 316 may carry signals that represent the alternating phases of a waveform, such as an alternating current (AC) waveform.

In some implementations, the bootstrap capacitor may be charged with power received from the high side power bus when both the first input signal and the second input signal are not active. In some implementations, the process 500 can also include providing the output voltage to an electric actuator, stalling the electric actuator to create a stall condition, and charging the bootstrap capacitor from the high side power bus during the stall condition. For example, the output signal line 340 can provide power to the electrical load 120, such as a motor, and when the phase power circuit 300 experiences a low speed or stall condition or when the PWM cycle for the low side switching device 318 is not enough to maintain voltage on bootstrap capacitor 304 on its own, the phase power circuit 300 can recharge the bootstrap capacitor 304 to a predetermined level.

In some implementations, the process 500 can include providing power received from the high side power bus to a second switching device configured to switch power to a second output port based on a second input signal received at a second input port, providing power received from the high side power bus to a second voltage regulating device configured to controllably supply power to a second bootstrap capacitor coupled between the second voltage regulating device and the second output port based on a second regulator input voltage received at a second regulator input port, providing, by the second switching device and in response to the second input signal, power to the second output port, blocking, by the second switching device and in absence of the second input signal, power from the output port, receiving, at the second regulator input port, the second regulator input voltage as a second voltage difference between a second output voltage on the second output port and the voltage present on the high side power bus, operating the second voltage regulating device based on the second regulator input voltage, wherein the second regulator input voltage is based on a second voltage difference between the second output voltage and the voltage present on the high side power bus, and charging the second bootstrap capacitor with power received from the high side power bus. For example, the example power inverter 200 of FIG. 2 includes a collection of phase power circuits 210a-210c. Each of these phase power circuits 210a-210c can be a separate instance of the phase power circuit 300. Each of the phase power circuits 210a-210c receives power (e.g., 12V power) from a power bus 220 that is shared among all of the phase power circuits 210a-210c.

In some implementations, the first input signal can be a direct current (DC) signal. In some implementations, the first input signal can be a pulse width modulated (PWM) signal. In some implementations, the first input signal can be a 0% duty cycle PWM signal. For example, one or more of the control input signals 330 can be pulse width modulated (PWM) signals, including 100% duty cycle PWM signals (e.g., a DC signal) and 0% duty cycle PWM signals (e.g., zero voltage).

Although a few implementations have been described in detail above, other modifications are possible. For example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A circuit comprising:
    a phase circuit comprising:
        an output port; and
        a high side circuit comprising:
            a first input port;
            a high side switching device configured to receive power from a high side power bus and switch power to the output port based on a first input signal received at the first input port;
            a voltage regulating device having a regulator input port; and
            a bootstrap capacitor coupled between the voltage regulating device and the output port;
            wherein the voltage regulating device is configured to receive power from the high side power bus and controllably supply power to the bootstrap capacitor based on a regulator input voltage received at the regulator input port, the regulator input voltage based on a voltage difference between a voltage present on the output port and a voltage present on the high side power bus.

2. The circuit of claim 1, further comprising a diode coupled between the output port and the regulator input port, wherein the based on a voltage difference between a voltage on the bootstrap capacitor and a reverse breakdown voltage of the diode.

3. The circuit of claim 2, wherein the diode is a Zener diode.

4. The circuit of claim 1, the high side circuit further comprising a resistor coupled between the high side power bus and the regulator input port.

5. The circuit of claim 1, the phase circuit further comprising:
    a low side circuit comprising:
        a second input port; and
        a low side switching device configured to receive power from the output port and switch the power to a low side power bus based on a second input signal received at the second input port.

6. The circuit of claim 5, wherein the low side power bus is at ground.

7. The circuit of claim 5, wherein the first input signal is not active when the second input signal is active, and the second input signal is not active when the input signal is active.

8. The circuit of claim 5, wherein the voltage regulating device is configured to receive power from the high side power bus and controllably supply power to the bootstrap capacitor when both of the first input signal and the second input signal are not active.

9. The circuit of claim 1, wherein the circuit is an inverter power supply comprising:
    the phase circuit, and
    at least another phase circuit configured to switch power to another output port based on another input signal received at another input port, and receive power from the high side power bus and controllably supply power to another bootstrap capacitor.

10. A method of operating an inverter power supply, the method comprising:
    providing power received from a high side power bus to a first switching device configured to switch power to an output port based on a first input signal received at a first input port;
    providing power received from the high side power bus to a voltage regulating device configured to controllably supply power to a bootstrap capacitor coupled between the voltage regulating device and the output port based on a regulator input voltage received at a regulator input port;

providing, by the first switching device and in response to the first signal, power to the output port;

blocking, by the first switching device and in absence of the first input signal, power from the output port;

receiving, at the regulator input port, the regulator input voltage as a voltage difference between an output voltage on the output port and a voltage present on the high side power bus;

operating the voltage regulating device based on the regulator input voltage; and charging the bootstrap capacitor with power received from the high side power bus.

11. The method of claim 10, wherein receiving, at the regulator input port, the regulator input voltage as a voltage difference between an output voltage on the output port and a voltage present on the high side power bus further comprises providing the output voltage to the regulator input port through a diode coupled between the output port and the regulator input port, wherein the regulator input voltage is further based on a voltage difference between a voltage on the bootstrap capacitor and a reverse breakdown voltage of the diode.

12. The method of claim 11, wherein the diode is a Zener diode.

13. The method of claim 11, wherein charging the bootstrap capacitor with power from the high side power bus further comprises providing power to the bootstrap capacitor through a resistor coupled between the power supply and the regulator input port.

14. The method of claim 10, further comprising providing the output voltage to ground through a second switching device configured to switch the output voltage to a low side power bus based on a second input signal received at a second input port.

15. The method of claim 14, wherein the first input signal is not active when the second input signal is active, and the second input signal is not active when the first input signal is active.

16. The method of claim 15, further comprising charging the bootstrap capacitor with power received from the high side power bus when both the first input signal and the second input signal are not active.

17. The method of claim 10, further comprising:

providing power received from the high side power bus to a second switching device configured to switch power to a second output port based on a second input signal received at a second input port;

providing power received from the high side power bus to a second voltage regulating device configured to controllably supply power to a second bootstrap capacitor coupled between the second voltage regulating device and the second output port based on a second regulator input voltage received at a second regulator input port;

providing, by the second switching device and in response to the second input signal, power to the second output port;

blocking, by the second switching device and in absence of the second input signal, power from the output port;

receiving, at the second regulator input port, the second regulator input voltage as a second voltage difference between a second output voltage on the second output port and the voltage present on the high side power bus;

operating the second voltage regulating device based on the second regulator input voltage, wherein the second regulator input voltage is based on a second voltage difference between the second output voltage and the voltage present on the high side power bus; and charging the second bootstrap capacitor with power received from the high side power bus.

18. The method of claim 10, further comprising:

providing the output voltage to an electric actuator;

stalling the electric actuator to create a stall condition; and charging the bootstrap capacitor from the high side power bus during the stall condition.

19. The method of claim 10, wherein the first input signal is a direct current (DC) signal.

20. The method of claim 10, wherein the first input signal is a pulse width modulated (PWM) signal.

21. The method of claim 17, wherein the first input signal is a 0% duty cycle PWM signal.

* * * * *

UNITED STATES PATENT AND TRADEMARK OFFICE
CERTIFICATE OF CORRECTION

| | | |
|---|---|---|
| PATENT NO. | : 9,705,423 B1 | Page 1 of 1 |
| APPLICATION NO. | : 15/052238 | |
| DATED | : July 11, 2017 | |
| INVENTOR(S) | : Dragan Micic | |

It is certified that error appears in the above-identified patent and that said Letters Patent is hereby corrected as shown below:

In the Specification

Column 1, Line 65, after "wherein the" insert -- regulator input voltage is --

In the Claims

Column 12, Line 23, after "wherein the" insert -- regulator input voltage is --

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*